United States Patent
Stadler et al.

(10) Patent No.: US 12,557,404 B2
(45) Date of Patent: Feb. 17, 2026

(54) MODULE ASSEMBLY FOR DETECTION OF X-RAY RADIATION

(71) Applicant: ams-Osram AG, Premstätten (AT)

(72) Inventors: Eduard Stadler, Graz (AT); Harald Etschmaier, Graz (AT); Fabian Huber, Graz (AT); Josef Pertl, Graz (AT)

(73) Assignee: AMS-OSRAM AG, Premstaetten (AT)

( * ) Notice: Subject to any disclaimer, the term of this patent is extended or adjusted under 35 U.S.C. 154(b) by 365 days.

(21) Appl. No.: 18/251,745

(22) PCT Filed: Nov. 11, 2021

(86) PCT No.: PCT/EP2021/081324
§ 371 (c)(1),
(2) Date: May 4, 2023

(87) PCT Pub. No.: WO2022/101313
PCT Pub. Date: May 19, 2022

(65) Prior Publication Data
US 2023/0411434 A1    Dec. 21, 2023

(30) Foreign Application Priority Data
Nov. 13, 2020   (DE) .......................... 102020130002

(51) Int. Cl.
*H01L 27/146* (2006.01)
*A61B 6/03* (2006.01)
(Continued)

(52) U.S. Cl.
CPC ......... *H10F 39/1895* (2025.01); *A61B 6/032* (2013.01); *G01T 1/2018* (2013.01);
(Continued)

(58) Field of Classification Search
CPC .. H10F 39/1895; H10F 39/018; H10F 39/811; H10F 39/1892; H10F 39/1898;
(Continued)

(56) References Cited

U.S. PATENT DOCUMENTS

| 8,125,066 B1 | 2/2012 | Kang |
| 2005/0139757 A1 | 6/2005 | Iwanczyk et al. |

(Continued)

FOREIGN PATENT DOCUMENTS

| CN | 104103595 A | 10/2014 |
| DE | 102012204766 B4 | 7/2015 |

(Continued)

OTHER PUBLICATIONS

International Search Report dated Feb. 16, 2022, PCT Application No. PCT/EP2021/081324, 3 pages.
(Continued)

*Primary Examiner* — Tong-Ho Kim
(74) *Attorney, Agent, or Firm* — MH2 Technology Law Group LLP

(57) ABSTRACT

A module assembly for the detection of X-ray radiation includes an X-ray sensor being configured to receive a photon of the X-ray radiation and to provide an electrical signal in response to the received photon. The module assembly further includes a system-in-package structure for processing the electrical signal, the system-in-package structure including an input/output terminal, a first interposer and a second interposer and an integrated circuit which are arranged in a stacked configuration in the system-in-package structure. The package structure can be assembled on all four lateral sides and is thus four-side buttable so that contiguous modules can be mounted on all four sides without a gap between pixels to read out data from large-pixelated detectors of the X-ray sensor.

15 Claims, 8 Drawing Sheets

(51) Int. Cl.
   *G01T 1/20* (2006.01)
   *G01T 1/24* (2006.01)
   *H01L 25/065* (2023.01)
   *H10F 39/00* (2025.01)
   *H10F 39/18* (2025.01)

(52) U.S. Cl.
   CPC ............ *G01T 1/24* (2013.01); *H01L 25/0655* (2013.01); *H10F 39/018* (2025.01); *H10F 39/811* (2025.01); *H10F 39/1892* (2025.01)

(58) Field of Classification Search
   CPC ..... H10F 39/026; H10F 39/804; A61B 6/032; G01T 1/2018; G01T 1/24; H01L 25/0655
   USPC .......................................................... 257/428
   See application file for complete search history.

(56) References Cited

U.S. PATENT DOCUMENTS

| | | |
|---|---|---|
| 2006/0244153 A1 | 11/2006 | Shibayama et al. |
| 2008/0011959 A1 | 1/2008 | Thorne |
| 2010/0109133 A1 | 5/2010 | Ito et al. |
| 2012/0133001 A1 | 5/2012 | Tkaczyk et al. |
| 2016/0154124 A1 | 6/2016 | Luhta et al. |
| 2017/0307766 A1* | 10/2017 | Abenaim ................ G01T 1/244 |
| 2018/0120447 A1* | 5/2018 | Ergler .................... G01T 1/244 |
| 2018/0130750 A1 | 5/2018 | Jung et al. |
| 2019/0090825 A1 | 3/2019 | Danzer et al. |
| 2019/0227182 A1 | 7/2019 | Ergler et al. |
| 2019/0339402 A1 | 11/2019 | Crestani et al. |
| 2020/0158894 A1 | 5/2020 | Ergler et al. |

FOREIGN PATENT DOCUMENTS

| | | | |
|---|---|---|---|
| DE | 102016218338 A1 | 3/2018 | |
| EP | 1492168 A1 | 12/2004 | |
| JP | 2003264280 A * | 9/2003 | ........... G01T 1/2018 |
| JP | 2004265884 A | 9/2004 | |
| JP | 2009544011 A | 12/2009 | |
| JP | 2010109112 A | 5/2010 | |
| JP | 2012118060 A | 6/2012 | |
| JP | 2018078274 A | 5/2018 | |
| WO | 2015012866 A1 | 1/2015 | |

OTHER PUBLICATIONS

German Search Report dated Jul. 7, 2021, DE Application No. 102020130002.6, 6 pages.

Office Action issued in corresponding Korean Patent Application No. 10-2023-7017902 dated Jul. 10, 2024, with English language translation, 14 pages.

Notice of Reasons for Rejection issued in corresponding Japanese Patent Application No. 2023-527425 dated Dec. 28, 2023, with English language translation, 15 pages.

Korean Notice of Allowance issued in Korean Patent Application No. 10-2023-7017902 issued Mar. 19, 2025, English language translation attached, 7 pages.

* cited by examiner

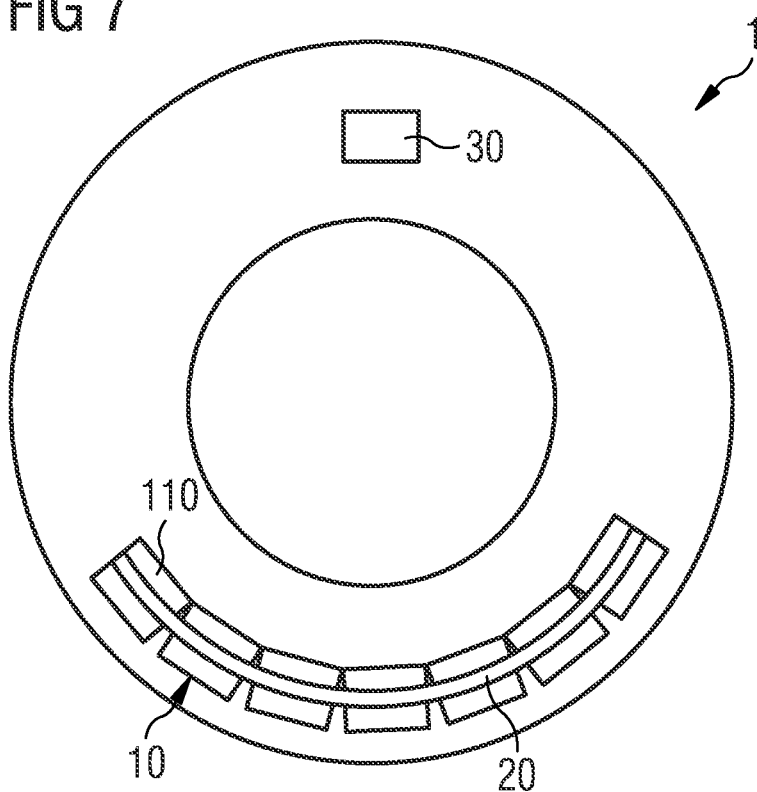

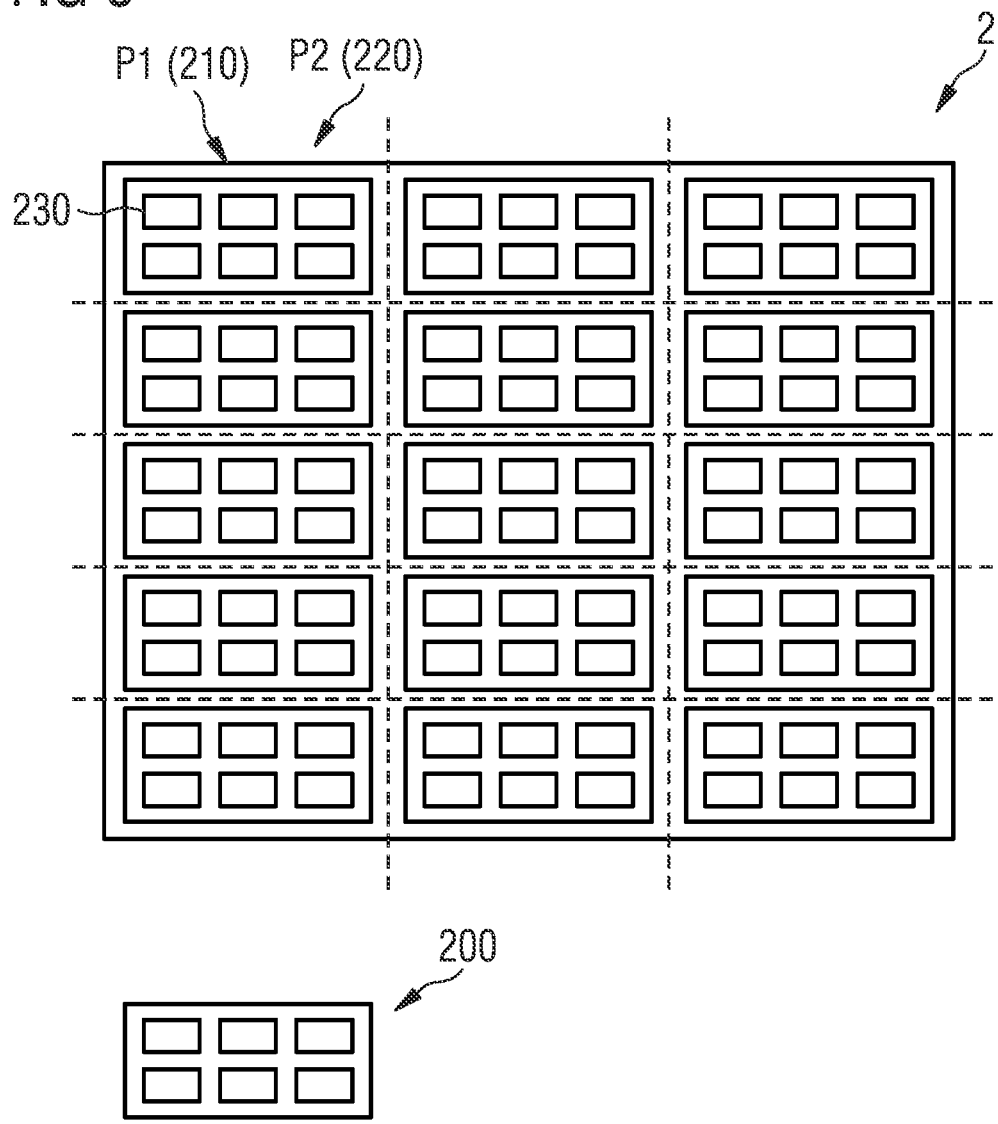

MODULE ASSEMBLY FOR DETECTION OF X-RAY RADIATION

CROSS-REFERENCE TO RELATED APPLICATIONS

The present application is a national stage entry from International Application No. PCT/EP2021/081324, filed on Nov. 11, 2021, published as International Publication No. WO 2022/101313 A1 on May 19, 2022, and claims priority to German Patent Application No. 10 2020 130 002.6, filed Nov. 13, 2020, the disclosures of all of which are hereby incorporated by reference in their entireties.

TECHNICAL FIELD

The disclosure relates to a module assembly for detection of X-ray radiation which may be used in a computed tomography application. The disclosure further relates to an X-ray detector, and a device for medical diagnostics comprising the X-ray detector. The disclosure also relates to a method for manufacturing a module assembly for detection of X-ray radiation.

BACKGROUND

In X-ray equipment, the X-ray radiation emitted by an X-ray source is detected and evaluated after passing through an object, such as human tissue. In X-ray diagnostics, computed tomography has been used for a long time to take high-resolution X-ray images.

Conventional computed tomography scanner use an indirect conversion principle to convert photons of X-rays into electric signals. The X-rays are first converted into visible light using a scintillator material, and then the visible light is converted into an electrical signal.

The new generation of computed tomography scanner uses a direct conversion principle. In the so-called photon counting computed tomography, a detector material which converts X-ray radiation directly into charge is used. In a photon counting system, single X-ray photon events are detected and counted, wherein the response depends on photon energy which allows to obtain spectral information.

In conventional computed tomography as well as in photon counting computed tomography, a large X-ray detector is required. The assembly of a large X-ray detector requires four side buttable modules to allow extending the detector's imaging area in all directions. Contiguous modules can be mounted on all four sides without a gap between pixels.

There is a desire to provide a module assembly for detection of X-ray radiation having a four-side buttable package which allows to build an X-ray detector having a large detector area that may be used, for example, in computed tomography.

A further desire is to provide an X-ray detector having a large detector area which may be used, for example, in computed tomography.

A further desire is to provide a device for medical diagnostics having a large X-ray detector to operate at very high count rates.

Furthermore, there is a need to provide a cost-effective method for manufacturing a module assembly for detection of X-ray radiation.

SUMMARY

A module assembly for detection of X-ray radiation having a four-side buttable configuration to allow the construction of a large X-ray detector is specified in claim 1.

A module assembly for detection of X-ray radiation comprises an X-ray sensor being configured to receive a photon of the X-ray radiation and to provide an electrical signal in response to the received photon. The module assembly further comprises a system-in-package structure for processing the electric signal. The system-in-package structure includes an input/output terminal, a first interposer and a second interposer and an integrated circuit. The first interposer and the second interposer and the integrated circuit are arranged in a stacked configuration in the system-in-package structure.

The integrated circuit is configured for evaluating the electrical signal. The first interposer is configured to provide an electrical connection between the X-ray sensor and the integrated circuit. The second interposer is configured to provide an electrical connection between the integrated circuit and the input/output terminal.

The module assembly has a system-in-package architecture that allows building a four side buttable module that reads out data from large, pixelated detectors of the X-ray sensor. The package structure can be assembled on all four lateral sides and is thus four-side buttable. A plurality of the module assemblies can thus be placed side-by-side to form a large continuous X-ray sensitive area of the X-ray detector.

The package structure allows to connect the X-ray sensor and input/output/supply connections on opposite sides, especially on a top and bottom side, of the package structure. Electric connections between the top and bottom side of the package structure are established within the package.

In contrast to a through-silicon-via approach, where the integrated circuit is directly mounted, for example directly soldered, to the X-ray sensor, the proposed system-in-package structure does not require matching of the integrated circuit and the X-ray sensor dimensions. The system-in-package structure allows an easy adaptation to the X-ray sensor used. If the design of the X-ray sensor changes, it is only necessary to change the first/top interposer, while the much more complex integrated circuit can remain unchanged. That means that changes in the X-ray sensor dimensions or pixel pitch do not require a complete redesigning of the integrated circuit.

The system-in-package structure comprising the input/output terminal, the first and second interposer as well as the integrated circuit is configured as a single, testable unit, whose functionality can be tested before the complete module assembly including the system-in-package structure and the X-ray sensor is finished, which leads to a significant yield increase.

Moreover, the system-in-package structure allows the integration of several electric components, such as the integration of a heating element for temperature regulation or the integration of passive circuit elements which may be necessary for the detector system, directly inside the package.

In the following, several embodiments of the module assembly are specified.

According to an embodiment of the module assembly, the first interposer has a first/top side to provide an electrical connection to the X-ray sensor, and a second/bottom side opposite to the first side. The integrated circuit is arranged on the second side of the first interposer.

The second interposer has a first/top side and a second/bottom side opposite to the first side. The input/output terminal is arranged on the second/bottom side of the second interposer. The first and the second interposer are stacked such that the first/top side of the second interposer faces the second/bottom side of the first interposer.

The system-in-package structure has input/output connections on the first/top side of the first interposer and on the second/bottom side of the second interposer so that the X-ray sensor can be mounted on the first/top side of the first interposer and an external connections for input/output or supply can be disposed on the second/bottom side of the second interposer.

The first and the second interposer are arranged spaced apart from each other. According to an embodiment of the module assembly, the system-in-package structure includes at least an interconnection element arranged between the first and the second interposer to provide an electrical connection between the second/bottom side of the first interposer and the first/top side of the second interposer. The interconnection elements between the first and the second interposer may be configured as copper or solder balls.

Electrical signals may also be transferred between the first/top and second/bottom sides of the first and second interposer. For this purpose, the first interposer comprises a first conductive path to electrically couple the integrated circuit to the X-ray sensor, and a second conductive path to electrically couple the integrated circuit to the interconnection element. The second interposer comprises a third conductive path to electrically couple the interconnection element to the input/output terminal on the second/bottom side of the second interposer.

According to a possible embodiment of the module assembly, the system-in-package structure comprises at least one shielding layer to shield the first conductive layer from the second conductive layer. The shielding layer may be arranged inside of the first interposer or on a surface of the integrated circuit. The shielding layer is provided to avoid mutual interference of the very small signal levels transmitted on the first and second conductive layer.

According to an embodiment of the module assembly, the system-in-package structure comprises a passive circuit element. The passive circuit element may be arranged on the second/bottom side of the first interposer or on the first/top side of the second interposer.

According to another embodiment of the module assembly, the system-in-package structure comprises a mold compound being arranged between the first and the second interposer.

The mold compound allows a fixed connection between the first and second interposer and thus holds the whole arrangement of the system-in-package structure together. The interconnection elements, for example copper or solder balls, and/or the passive circuit elements may be embedded in the mold compound.

According to another possible embodiment of the module assembly, the system-in-package structure comprises a heating element for temperature regulation. The heating element may be disposed on at least one of the first and second side of the first interposer or at one of the first and second side of the second interposer or, according to another embodiment, inside of the first or second interposer.

According to a possible embodiment of the module assembly, the heating element is arranged to extend, in a cross-sectional view of the system-in-package structure, over the entire area of the first and second interposer.

According to another possible embodiment of the module assembly, the heating element is arranged to extend, in a cross-sectional view of the system-in-package structure, over a respective area of the first or second interposer located in a vertical projection, viewed from the top of the module assembly, laterally offset to the integrated circuit.

The heating element is configured to be externally controlled by a signal applied to the input/output terminal or to be internally controlled by the integrated circuit.

An embodiment of an X-ray detector having a large pixelated detector area is specified in claim 14.

The X-ray detector comprises a plurality of the module assembly for detection of X-ray radiation, as described above. Each X-ray sensor of the module assemblies comprises a pixelated detector area including a plurality of pixels to respectively receive the X-ray radiation. The plurality of the module assemblies are arranged side by side so that the respective pixelated detector area of the X-ray sensors abuts each other without forming a gap there between. The plurality of butted module assemblies allows the construction of large X-ray sensitive detector surface.

A device for medical diagnostics comprising the X-ray detector is specified in claim 15. The device may be configured, for example, as an X-ray apparatus for a computed tomography scanner.

A method for manufacturing a module assembly for detection of X-ray radiation is specified in claim 13.

According to the proposed method for manufacturing the module assembly for detection of X-ray radiation, a panel assembly is build up using a panel level process. The panel assembly includes a first panel for forming the first interposer, and a second panel for forming the second interposer, and a plurality of integrated circuits that are mounted to a surface of the first panel. The panel assembly is singularized to provide individual ones of the system-in-package structure. A respective X-ray sensor is placed on each of the individual ones of the system-in-package structure.

That means that the system-in-package structure is manufactured in a panel level process flow, apart from the complete module assembly. The fabrication of a plurality of the package structures in a panel level process offers a cost-effective fabrication method. Moreover, each individual system-in-package structure and X-ray sensor is configured as a respective single testable unit that can be tested for proper functionality before placing the X-ray sensor on the system-in-package structure.

Additional features and advantages of the X-ray module assembly are set forth in the detailed description that follows. It is to be understood that both the foregoing general description and the following detailed description are merely exemplary, and are intended to provide an overview or framework for understanding the nature and character of the claims.

BRIEF DESCRIPTION OF THE DRAWINGS

The accompanying drawings are included to provide further understanding, and are incorporated in, and constitute a part of, the specification. As such, the disclosure will be more fully understood from the following detailed description, taken in conjunction with the accompanying figures in which:

FIG. 7 shows a device for medical diagnostics, a computed tomography scanner, comprising an X-ray detector;

FIG. 9 shows a panel assembly used in a manufacturing process for manufacturing a plurality of system-in-package structures.

DETAILED DESCRIPTION

Figure 1:
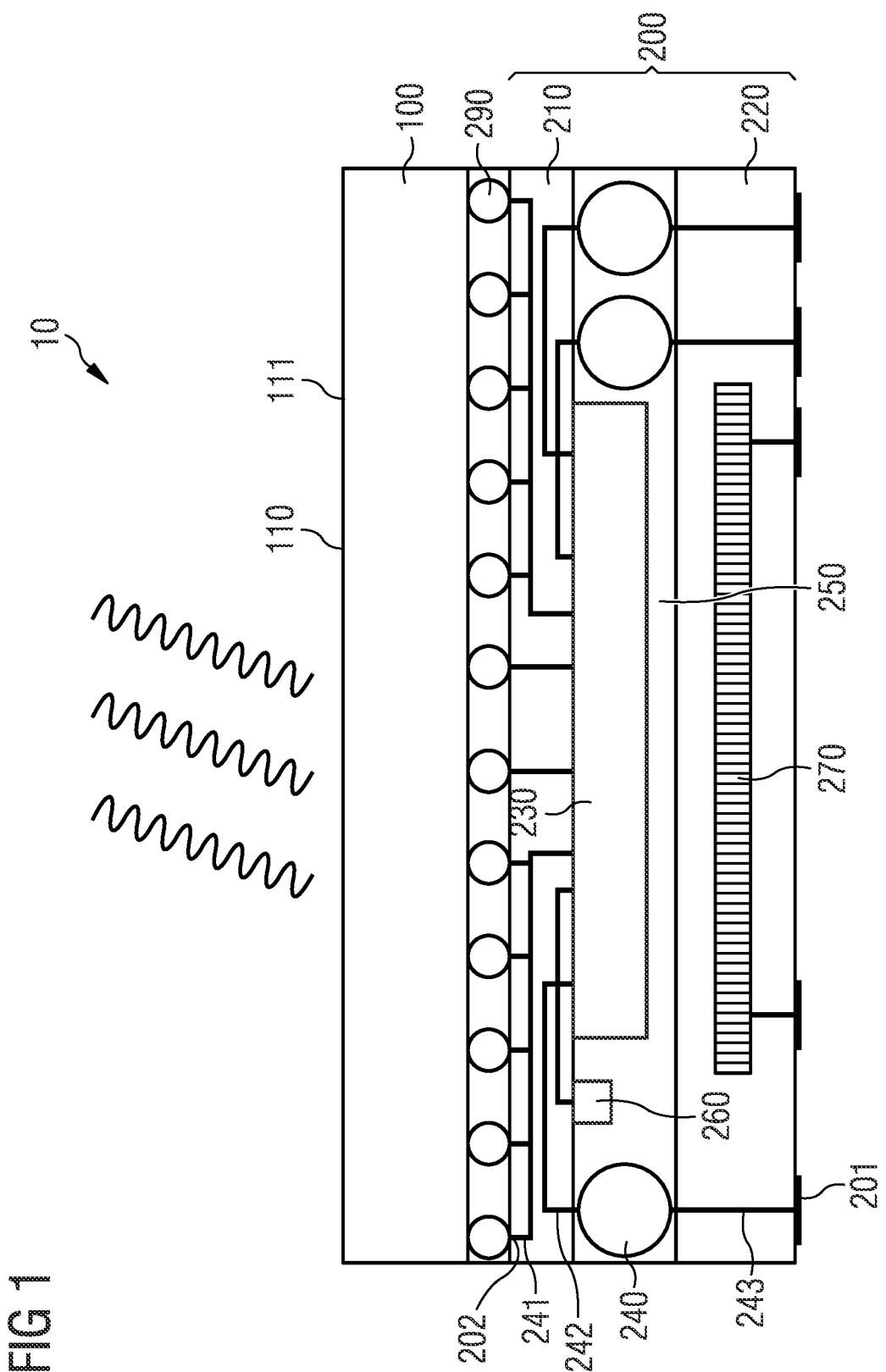
FIG. 1 shows a cross-sectional view of a module assembly for detection of X-ray radiation.

An embodiment of a module assembly for detection of X-ray radiation is shown in a cross-sectional view in FIG. 1. The module assembly 10 comprises an X-ray sensor 100 being configured to receive a photon of X-ray radiation. The X-ray sensor 100 provides an electrical signal in response to the received photon. The X-ray sensor 100 comprises a pixelated detector area 110 including a plurality of pixels 111 to respectively receive the X-ray radiation. The X-ray sensor 100 provides an electrical signal for each photon impinging on the pixelated detector area 110. The electrical signals may be provided at outputs located at the bottom surface of the X-ray detector 100.

The X-ray sensor 100 may be configured for indirect or direct conversion of the X-rays into electrical charges. For direct conversion, as used in photon counting CT, the X-ray sensor 100 shown in FIG. 1 comprises a direct conversion material like CZT or CdTe. A material of CZT or a material of CdTe is directly attached on top of the system-in-package structure 200. It converts the X-ray photon directly into an electrical signal.

For indirect conversion, as used in classic CT, the X-ray sensor 100 comprises a scintillator and a photodiode array. The X-ray sensor 100 is configured as a stack of a scintillator and photodiode. The photodiode array will be directly attached on top of the system-in-package structure 200. In addition, a scintillator/crystal is glued on top of the photodiode array. The scintillator converts the X-ray photon into visible light. The visible light is captured by a photodiode array that converts the light into an electrical signal.

The module assembly 10 further comprises a system-in-package structure 200 for processing the electrical signals provided by the X-ray sensor 100. The system-in-package structure 200 includes input/output terminals 201, a first/top interposer 210 and a second/bottom interposer 220 as well as an integrated circuit/ASIC 230. The first interposer 210, the second interposer 220 and the integrated circuit 230 are arranged in a stacked configuration in the system-in-package structure 200.

The integrated circuit 230 is configured for evaluating an electrical signal received from the X-ray sensor 100. In particular, the integrated circuit may be configured to evaluate an analog electrical signal provided from the X-ray sensor 100 and to output a digital signal in response to the analog electrical signal.

The first interposer 210 is configured to provide an electrical connection between the X-ray sensor 100 and the integrated circuit 230. The second interposer 220 is configured to provide an electrical connection between the integrated circuit 230 and the input/output terminals 201. According to a preferred embodiment, the first and the second interposer have the same material, for example a multi-layer, glass fiber reinforced epoxy laminate with a particularly low coefficient of thermal expansion.

The first interposer 210 has a first/top side to provide an electrical connection to the X-ray sensor 100. Electrical contacts 202, for example, conductive pads may be provided on the surface of the first interposer 210 to provide an electrical connection to the system-in-package structure 200. According to a possible embodiment, as illustrated in FIG. 1, electrical connection elements 290, for example solder spheres or copper balls, are provided between the first interposer 210 and the X-ray sensor 100 for the electrical connection between the X-ray sensor 100 and the first interposer 210. The electrical connection elements 290 are arranged between a bottom surface of the X-ray sensor 100 and the electrical contacts 202.

The integrated circuit 230 is arranged on the second/bottom side of the first interposer 210. The integrated circuit 230 converts the analog electrical signals received from the X-ray sensor 100 to digital output signals. For keeping the connection short, the integrated circuit 230 may be flip-chip mounted on the first interposer 210.

The first interposer 210 includes a plurality of conductive paths 241 to electrically couple the electrical contacts 202 on the first/top side of the first interposer 210 to the integrated circuit 230. The first interposer 210 thus connects the pixels 111 of the pixelated detector area 110 of the X-ray sensor 100 to the integrated circuit 230 via the connection elements 202 and the conductive path 211.

As illustrated in FIG. 1, the area occupied by the integrated circuit 230 on the second/bottom side of the first interposer 210 is much smaller than the area of the X-ray sensor 100 which covers the complete first side of the first interposer 210. Nevertheless, the arrangement of conductive paths 241 inside the first interposer 210 allows to electrically contact each of the electrical contacts 202 on the first/top side of the first interposer 210 with the integrated circuit 230. In conclusion, the coupling of the integrated circuit 230 to the X-ray sensor 100 via the first interposer 210 allows for a significant cost reduction, because the integrated circuit 230 covers only a small portion of the X-ray sensor 100.

The second interposer 220 has a first/top side and a second/bottom side opposite to the first side. The input/output terminals 201 are arranged on the second side of the second interposer 220. The terminals 201 may also be configured as supply terminals to apply a supply voltage to supply the integrated circuit 230 with power.

The first and the second interposer 210, 220 are stacked such that the first/top side of the second interposer 220 faces the second/bottom side of the first interposer 210. The first interposer 210 and the second interposer 220 are arranged spaced apart from each other.

The system-in-package structure 200 includes (vertical) interconnection elements 240 (Through Package Vias; TPV) arranged between the first and the second interposer 210, 220 to provide an electrical connection between the second/bottom side of the first interposer 210 and the first/top side of the second interposer 220. The interconnection elements 240 may be configured as copper or solder balls. The interconnections 240 are cost-effective alternatives to Through-Silicon Vias.

As shown in FIG. 1, output signals generated by the integrated circuit 230 are passed through the first interposer 210 via conductive paths 242 and connected to the second interposer 220 via the interconnection elements 240. The interconnection elements 241 are in electrical contact with the input/output terminals 201 via conductive paths 243 arranged inside the second interposer 220.

The system-in-package structure 200 may comprise a passive circuit element 260, for example a capacitor, a thermistor, a resistor, etc. The system-in-package structure 200 allows the integration of passive circuit elements 260 necessary for the operation of the X-ray detector system directly inside the package. As shown in FIG. 1, the passive circuit element 260 may be electrically connected to the integrated circuit 230 via conductive paths inside of the first interposer 210. The passive circuit element 260 can be arranged on the second/bottom side of the first interposer 210 or on the first/top side of the second interposer 220.

The system-in-package structure 200 comprises a mold compound 250 being arranged between the first interposer 210 and the second interposer 220 to provide a stable cohesion between the first interposer 210 and the second interposer 220 of the system-in-package structure 200. As illustrated in FIG. 1, the interconnection elements 241, for example solder or copper balls, and/or the passive circuit elements 260 can be embedded in the mold compound 250.

As shown in FIG. 1, the first and second interposer 210, 220 are joined by single interconnection elements 240, for example solder or copper balls, being arranged between the first and second interposer. The interconnection elements 240 are soldered to the first and second interposer 210, 220 simultaneously and are embedded in the mold compound 250. The mold compound 250 fills up the space between the first and second interposer 210, 220 completely. That means that the first interposer 210 is directly arranged on an upper side of the mold compound 250 and is thus in direct contact with the mold compound 250 without providing a gap therebetween, and also the second interposer 220 is directly arranged on the bottom side of the mold compound 250 and is thus in direct contact with the mold compound 250 without providing a gap therebetween. This enables to provide the system-in-package structure 200 of first interposer 210, mold compound 250 and second interposer 220 as a single symmetrical unit. The proposed arrangement of the system-in-package structure 200 offers advantages in terms of mechanical performance and thermal properties of the module assembly.

Regarding mechanical management, the mold compound and/or the interconnection elements 240 enable to provide sufficient stability for the system-in-package structure 200 to meet strict mechanical requirements, such as warpage. The single unit and symmetrical stack-up of the system-in-package structure 200 allows to provide a flat, i.e. low warpage, surface on the top side of the first interposer 210 that is essential for the connection with the X-ray sensor 100. The flatness at the top surface of the interposer 210 is important to ensure that the connection elements 290, for example small solder balls, actually form a reliable connection between the sensor 100 and the package 200 over the entire surface of the interposer 210. Therefore, it is important to provide sufficient planarity of the package 200 to achieve co-planarity with the sensor 100, thereby reducing mechanical stresses in the sensor and enabling a reliable connection between the package and the sensor. Moreover, the symmetrical arrangement of two interposers 210, 220 above and below mold compound 250 in the system-in-package structure allows the coefficient of thermal expansion of the system-in-package structure 200 to be well controlled and matched to the thermal expansion coefficient of the X-ray sensor 100.

Regarding thermal management, the system-in-package structure 200 allows an efficient heat transfer from the integrated circuit 230 to the second interposer 220. Since the second interposer 220 touches the mold compound 250 at its complete upper surface and is thus in direct contact to the mold compound 250, the heat generated by the integrated circuit 230 during its intended operation can be reliably dissipated via the mold compound 250 and the second interposer 220.

For the intended application of X-ray detection, it is necessary that the module assembly, especially the pixelated detector area 110 of the X-ray sensor 100, is kept at a constant temperature that is homogeneously distributed across the system-in-package.

In order to keep the overall temperature of the module assembly 10 constant and homogeneous, the system-in-package structure 200 comprises a heating element 270 for temperature regulation. The heating element 270 may be disposed on at least one of the first and second side of the first interposer 210, or at one of the first and second sides of the second interposer 220.

According to another embodiment, the heating element 270 may be disposed inside of the first interposer 210 or inside of the second interposer 220, as illustrated in FIGS. 2A to 4B. The heating element 270 may be configured as a copper-meander that is integrated within one of the first and second interposers or on the top or bottom side/surface of one of the first and bottom interposer 210 and 220, i.e. directly inside the package.

The integration of the heating element inside the first or second interposer 210, 220 stabilizes the temperature of the sensing system. The heating element 270 enables a homogenous temperature distribution across the entire package. In particular, the heating element 270 allows to keep the module assembly, especially the pixelated detector area 110, at a constant absolute temperature.

In comparison to a heater integrated in the silicon material of the integrated circuit 230, the arrangement of the heating element 270 on the first or second interposer, or the integration of the heating element 270 in the material of the first or second interposer 210, 220 enables a flexible design.

Figure 2A:
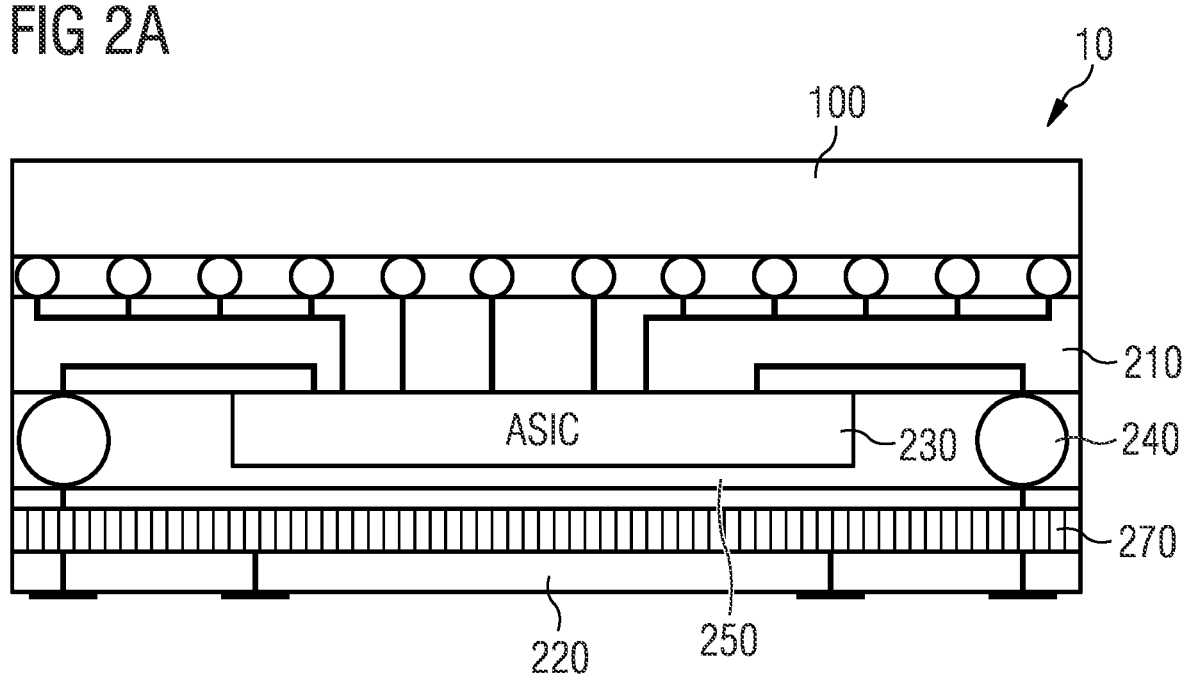
FIG. 2A shows an embodiment of a module assembly with a heating element integrated inside a bottom interposer over an entire package area.

FIG. 2A shows an embodiment of the module assembly 10, wherein the heating element 270 is arranged inside of the second interposer 220 and extends, in a cross-sectional view of the system-in-package structure 200, over the entire area of the second interposer 220. The heating element 270 may be configured as an externally controlled heater in the second interposer 220.

Figure 2B:
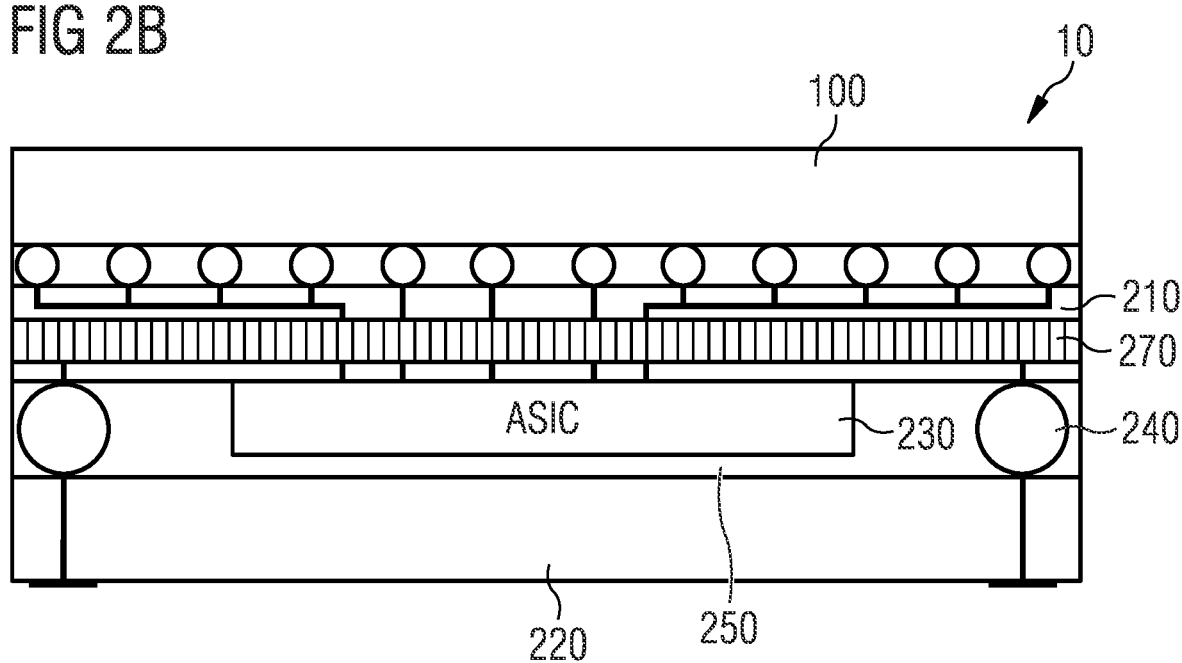
FIG. 2B shows an embodiment of a module assembly for detection of X-ray radiation with a heating element integrated in a top interposer over an entire package area.

According to the embodiment of the module assembly shown in FIG. 2B, the heating element 270 is disposed inside of the first interposer 210, and extends, in a cross-sectional view of the system-in-package structure 200, over the entire area of the first interposer 210. The heating element 270 may be configured as an externally controlled heater.

Figure 3A:
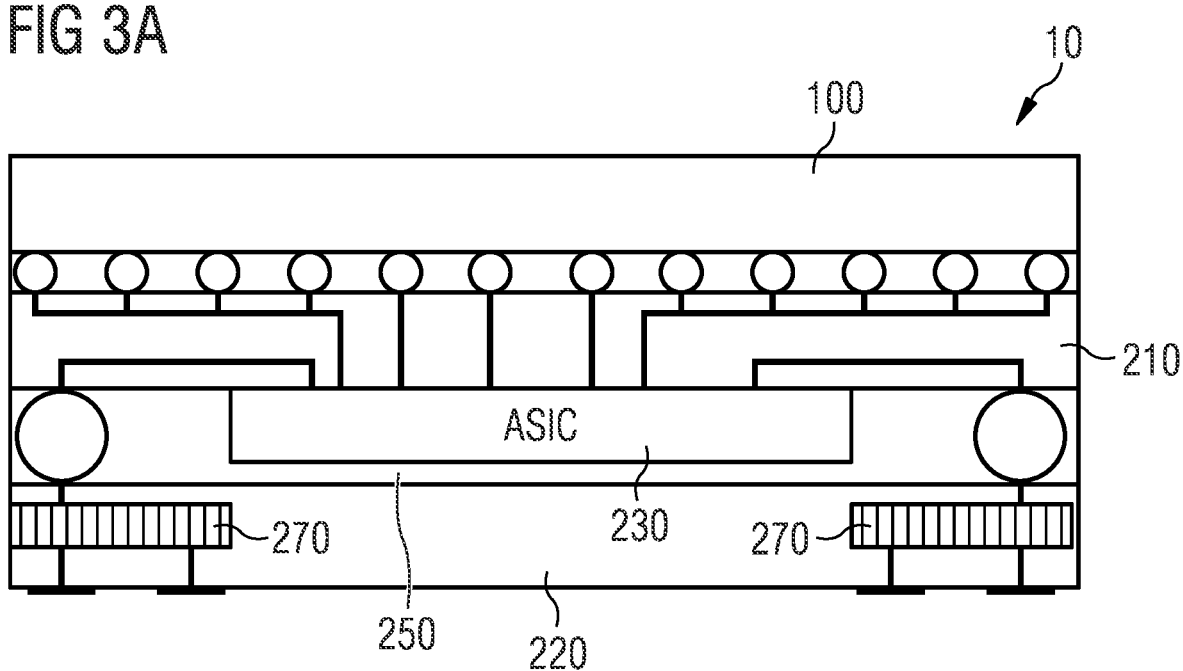
FIG. 3A illustrates an embodiment of a module assembly for detection of X-ray radiation with a heating element integrated in a bottom interposer over a non-silicon area.
Figure 3B:
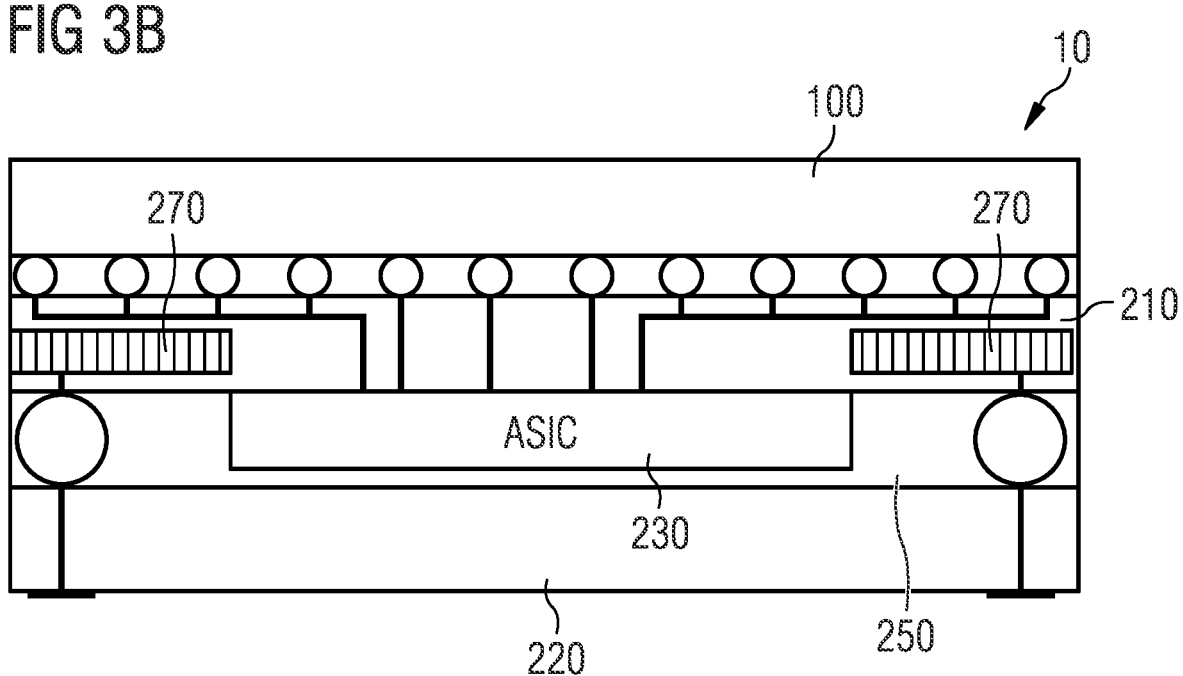
FIG. 3B shows an embodiment of a module assembly for detection of X-ray radiation with a heating element integrated in a top interposer over a non-silicon area.

FIGS. 3A and 3B show embodiments of the module assembly 10, wherein the heating element 270 is arranged inside the second interposer 220 (FIG. 3A) or inside the first interposer 210 (FIG. 3B). Regarding the embodiments shown in FIGS. 3A and 3B, the heating element 270 is arranged to extend, in a cross-sectional view of the systemin-package structure 200, over a respective area of the first or second interposer 210, 220 located in a vertical projection, viewed from the top of the module assembly 10, laterally offset to the integrated circuit 230. That means that the heating element 270 is arranged over a non-silicon area of the integrated circuit 230.

Figure 4A:
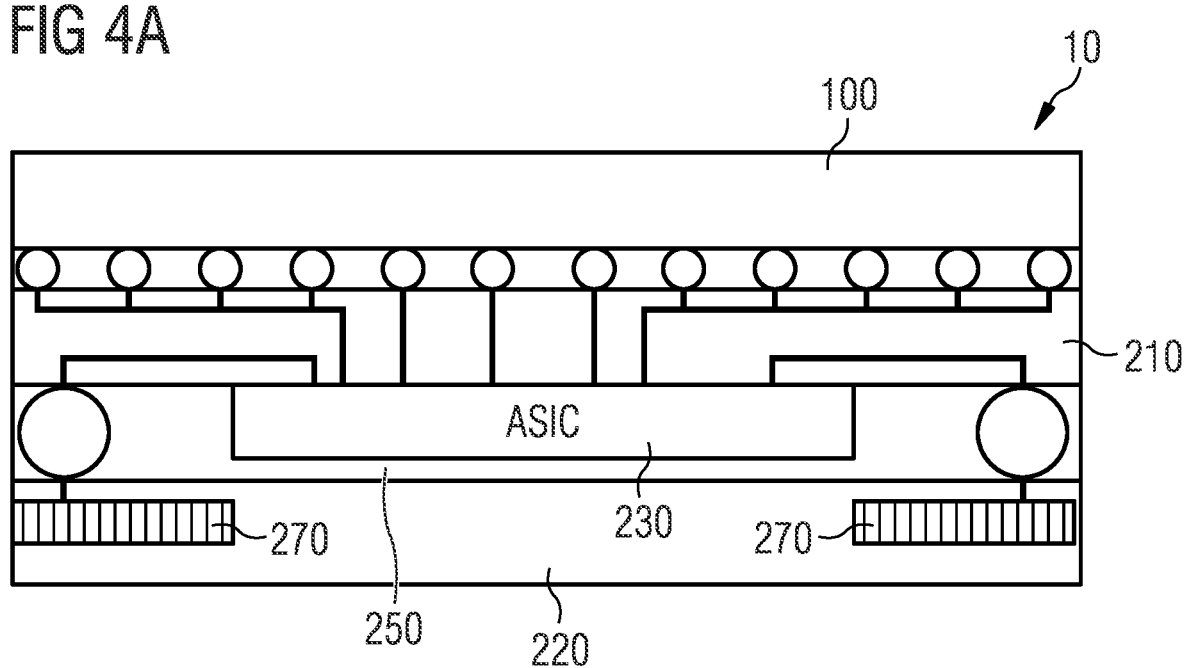
FIG. 4A shows an embodiment of a module assembly for detection of X-ray radiation with an integrated circuit controlled heating element integrated in a bottom interposer.
Figure 4B:
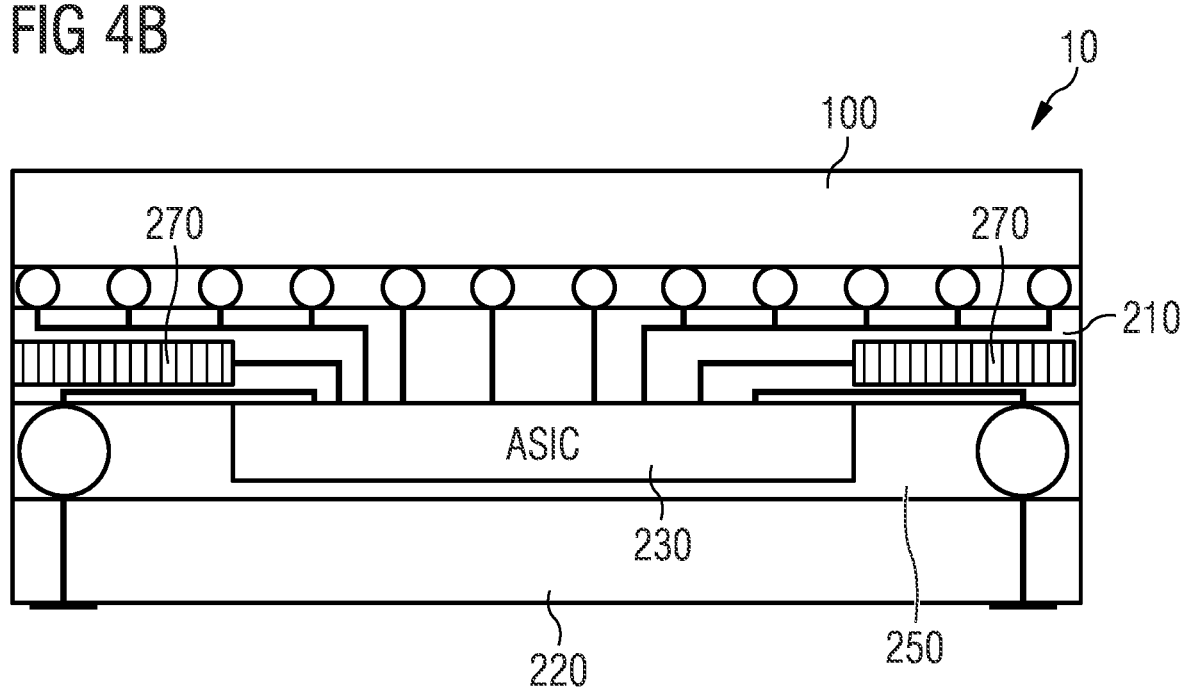
FIG. 4B shows an embodiment of a module assembly for detection of X-ray radiation with an integrated circuit controlled heating element integrated in a top interposer.

FIGS. 3A and 3B show the heating element 270 being configured to be externally controlled by a signal applied to the input/output terminals 201. FIGS. 4A and 4B show an embodiment of the module assembly 10, wherein the heating element 270 is arranged in the same way as shown in FIGS. 4A and 4B, i.e. inside a respective area of the first or second interposer 210, 220 located in vertical projection laterally offset to the integrated circuit 230. In contrast to the embodiment shown in FIGS. 3A and 3B, the heating element 270 shown in FIGS. 4A and 4B is configured to be internally controlled by the integrated circuit 230.

For monitoring the temperature of the module assembly 10, a temperature sensing element, not shown in the figures, may be included on the second interposer 220. The supply voltage of this separate heating element is not limited by the CMOS process node and can be adjusted in a simple manner.

Figure 5:
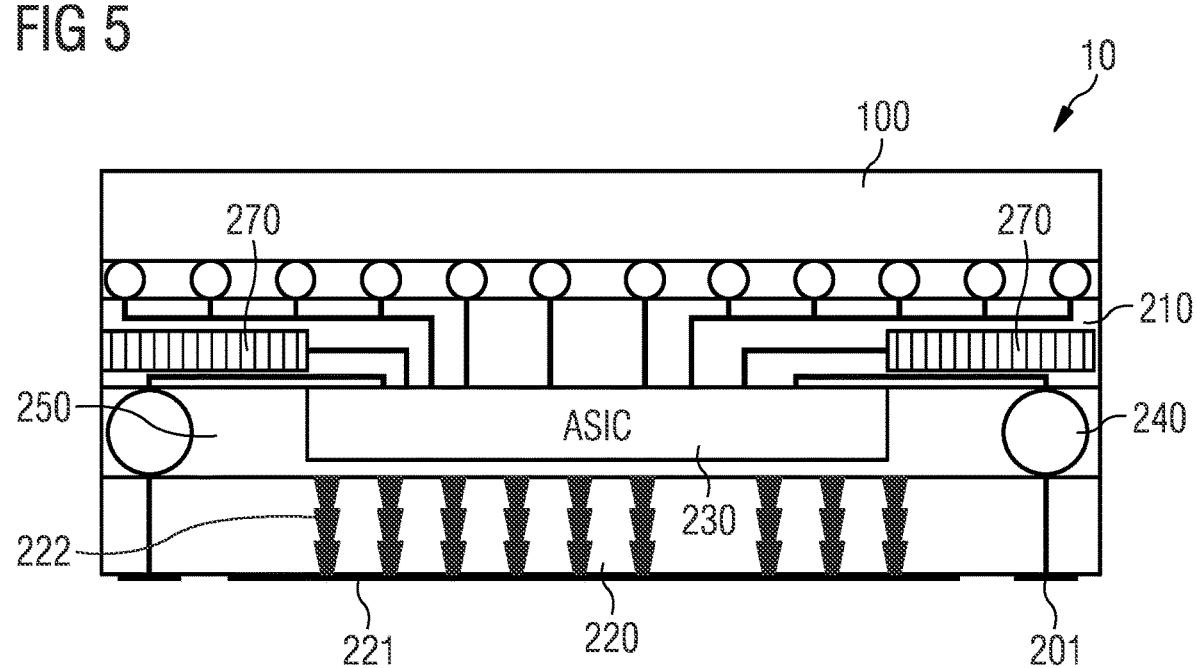
FIG. 5 shows an embodiment of a module designed in a way to pass the heat from an integrated circuit efficiently to a heatsink.

FIG. 5 shows an embodiment of the module assembly 10 in which the structure of the second interposer 220 is designed in a way to pass the heat efficiently to a heatsink. This can be achieved by providing a thermal pad 221 on the bottom surface of the second interposer 220. The large thermal pad 221 is configured for soldering the system-in-package structure 200 to a carrier, for example a printed circuit board, with heatsink. Furthermore, thermal vias 222 can be embedded in the second interposer 220 to enable heat transfer from the integrated circuit 230 to the thermal pad 221. The thermal vias 222 may be provided in a stacked or staggered design. According to a possible embodiment, the thermal vias 222 may be configured as copper filled vias. It should be noted that the heat dissipation design shown in FIG. 5 can be used in any of the embodiments shown in the other figures.

Figure 6:
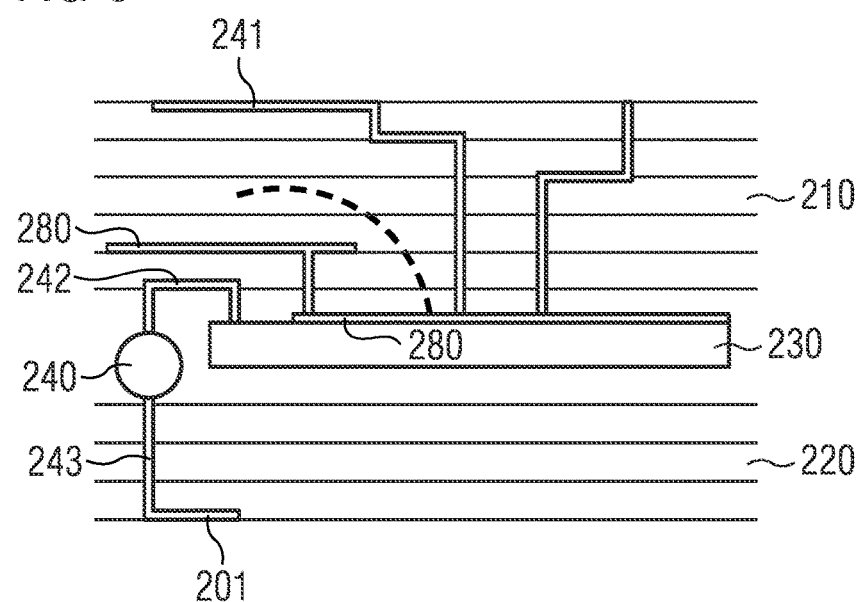
FIG. 6 illustrates a shield concept of a module assembly for detection of X-ray radiation.

FIG. 6 illustrates a cross-sectional view of the system-in-package structure 200, wherein the system-in-package structure 200 comprises at least one shielding layer 280 to shield the first conductive path 241 from the second conductive path 242. The shielding layer 280 may be arranged inside of the first interposer 210, or on a surface of the integrated circuit 230. The shielding layer 280 is used to shield the first and second conductive path 241, 242 from each other so that signal transmission with low levels over the conductive path 211 and 212 is not disturbed.

FIG. 7 shows an embodiment of a device for medical diagnostics 1. The device 1 is configured as an X-ray apparatus for a computed tomography scanner. The device 1 comprises an X-ray detector 20 comprising a plurality of the module assemblies 10 for detection of X-ray radiation.

As illustrated in FIG. 7, the configuration of the module assemblies 10 being four-side buttable allows the various module assemblies 10 to be placed side-by-side for extending the detector's imaging area in all directions. Contiguous modules can be mounted on all four sides without a gap between pixels.

Figure 8A:
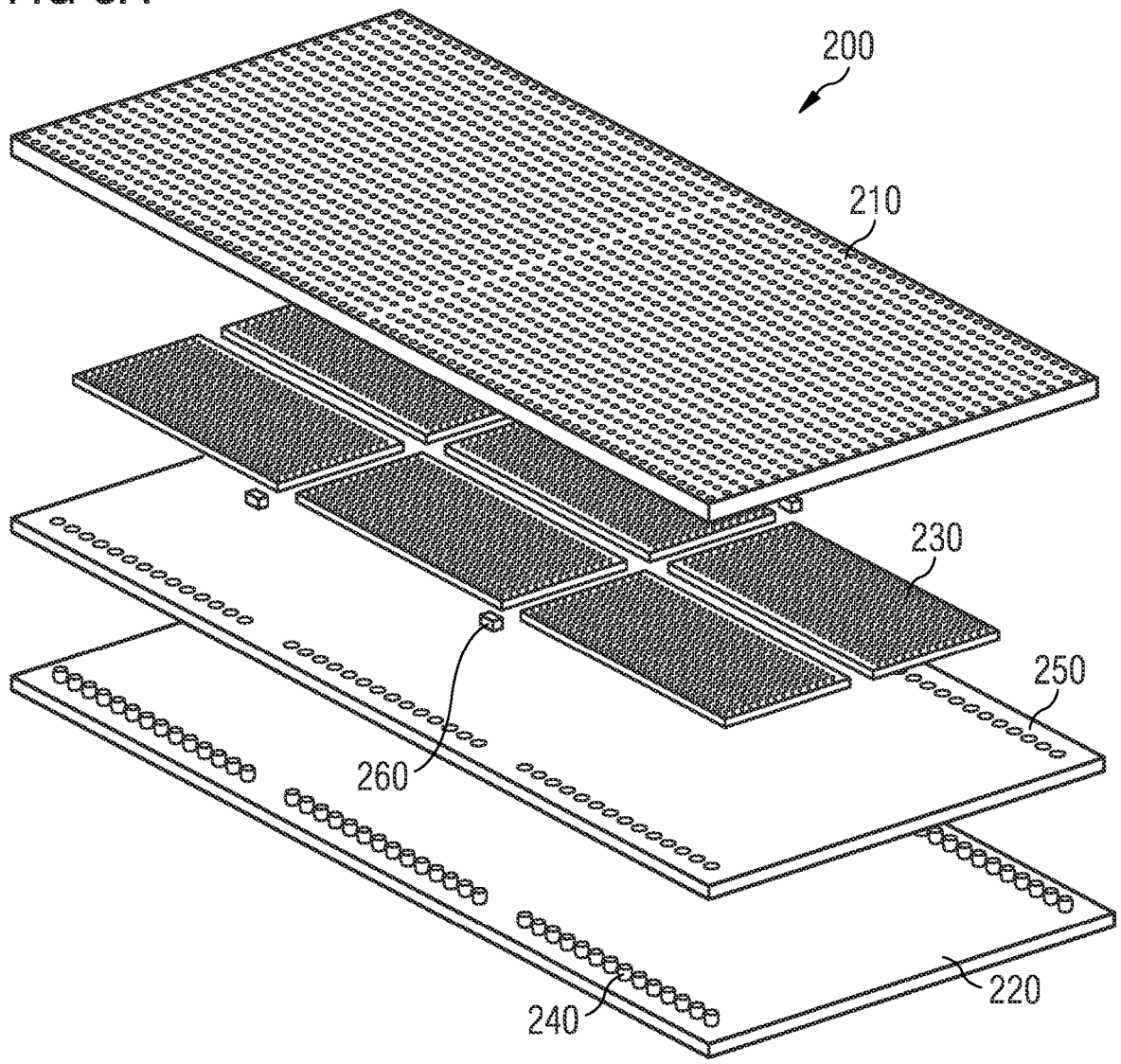
FIG. 8A shows an exploded view of a system-in-package structure comprising a plurality of integrated circuits.
Figure 8B:
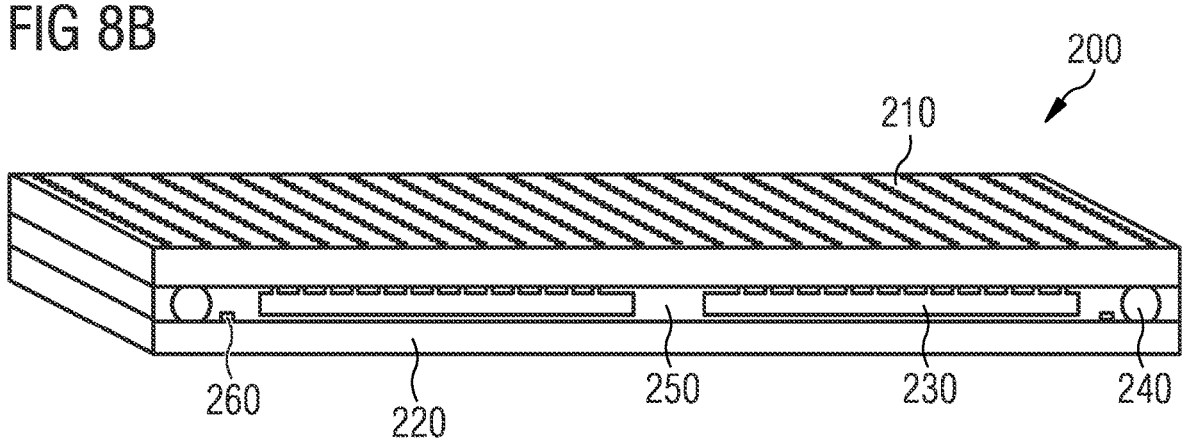
FIG. 8B shows a spatial view of a system-in-package structure in a side view.

FIG. 8A shows an exploded view of a system-in-package structure 200 comprising the first interposer 210, a plurality of integrated circuits 230, passive circuit elements 260, the mold compound 250, interconnections elements 240, and the second interposer 220. FIG. 8B shows a spatial view of the system-in-package structure 200 in a side view. As illustrated in FIGS. 8A and 8B, a plurality of integrated circuits 230 may be integrated/embedded in the system-in-package structure 200. Multiple integrated circuits/ASICs can be arranged to have equal length of the connection lines/conductive paths between X-ray sensor pixels to the integrated circuits/ASICs.

FIG. 9 shows a panel assembly 2 used in a manufacturing process for manufacturing a plurality of system-in-package structures 200. In order to fabricate the system-in-package structure 200, the panel assembly 2 is build up using a panel level process. The panel assembly 2 includes a first/top panel P1 for forming the first/top interposer 210, a second/bottom panel P2 for forming the second/bottom interposer 220 and a plurality of integrated circuits/ASICs 230 mounted to a bottom surface of the first panel P1. FIG. 9 illustrates a top view through the panel assembly 2. The first/top panel P1 and the second/bottom panel P2 are shown transparent in the simplified representation of FIG. 9.

The panel assembly 2 shown in FIG. 9 is singularized to provide individual ones of the system-in-package structure 200. FIG. 9 shows by dashed lines the sawing streets where the system-in-package structures are cut out from the entire panel assembly 2. The illustrated example of the panel assembly 2 shows 4×3=12 system-in-package structures 200. Each system-in-package structure 200 comprises six integrated circuits/ASICs 230. In order to manufacture the module assembly 10 for the detection of X-ray radiation, a respective X-ray sensor 100 is placed on each of the individual ones of the system-in-package structures 200.

The individual system-in-package structures 200 respectively form a single testable unit that can be tested for proper functionality before a respective X-ray sensors 100 is placed on each of the singularized structures 200. This offers a cost-effective fabrication method.

The embodiments of the system-in-package structure 200, the module assembly 10 for the detection of X-ray radiation, the X-ray detector 20, and the device 1 for medical diagnostics disclosed herein have been discussed for the purpose of familiarizing the reader with novel aspects of the proposed designs. Although preferred embodiments have been shown and described, many changes, modifications, equivalents and substitutions of the disclosed concepts may be made by one having skill in the art without unnecessarily departing from the scope of the claims.

In particular, the design of the system-in-package structure 100, the module assembly 10, the X-ray detector 20 and the device 1 for medical diagnostics is not limited to the disclosed embodiments, and gives examples of many alternatives as possible for the features included in the embodiments discussed. However, it is intended that any modifications, equivalents and substitutions of the disclosed concepts be included within the scope of the claims which are appended hereto.

Features recited in separate dependent claims may be advantageously combined. Moreover, reference signs used in the claims are not limited to be construed as limiting the scope of the claims.

Furthermore, as used herein, the term "comprising" does not exclude other elements. In addition, as used herein, the article "a" is intended to include one or more than one component or element, and is not limited to be construed as meaning only one.

The invention claimed is:
1. A module assembly for detection of X-ray radiation, comprising:
an X-ray sensor being configured to receive a photon of the X-ray radiation and to provide an electrical signal in response to the received photon, a system-in-package structure for processing the electrical signal, the system-in-package structure including an input/output terminal, a first interposer and a second interposer and an integrated circuit, the first interposer and the second interposer and the integrated circuit being arranged in a stacked configuration in the system-in-package structure, wherein the integrated circuit is configured for evaluating the electrical signal, wherein the first interposer is configured to provide an electrical connection between the X-ray sensor and the integrated circuit, wherein the second interposer is configured to provide an electrical connection between the integrated circuit and the input/output terminal, and wherein the system-in-package structure comprises a mold compound being arranged between the first and the second interposer such that each of the first and second interposer is in direct contact with the mold compound.

2. The module assembly of claim 1, wherein the first interposer has a first side to provide an electrical connection to the X-ray sensor, and a second side opposite to the first side, the integrated circuit being arranged on the second side of the first interposer, wherein the second interposer has a first side and a second side opposite to the first side, the input/output terminal being arranged on the second side of the second interposer, wherein the first and the second interposer are stacked such that the first side of the second interposer faces the second side of the first interposer.

3. The module assembly of claim 2, wherein the first and the second interposer are arranged spaced apart from each other, wherein the system-in-package structure includes at least an interconnection element arranged between the first and the second interposer to provide an electrical connection between the second side of the first interposer and the first side of the second interposer.

4. The module assembly of claim 3, wherein the interconnection element is configured as a copper or solder ball.

5. The module assembly of claim 1, wherein the first interposer comprises a first conductive path to electrically couple the integrated circuit to the X-ray sensor, and a second conductive path to electrically couple the integrated circuit to the interconnection element, wherein the second interposer comprises a third conductive path to electrically couple the interconnection element to the input/output terminal.

6. The module assembly of claim 5, wherein the system-in-package structure comprises at least one shielding layer to shield the first conductive path from the second conductive path, wherein the shielding layer is arranged inside of the first interposer or on a surface of the integrated circuit.

7. The module assembly of claim 1, wherein the system-in-package structure comprises a passive circuit element, the passive circuit element being arranged on the second side of the first interposer or on the first side of the second interposer.

8. The module assembly of claim 1, wherein the system-in-package structure comprises a heating element for temperature regulation, the heating element being disposed on at least one of the first and second side of the first interposer, or on at least one of the first and second side of the second interposer, or inside of the first or second interposer.

9. The module assembly of claim 8, wherein the heating element is arranged to extend, in a cross-sectional view of the system-in-package structure, over the entire area of the first or second interposer.

10. The module assembly of claim 8, wherein the heating element is arranged to extend, in a cross-sectional view of the system in package structure, over a respective area of the first or second interposer located in vertical projection, viewed from to the top of the module assembly, laterally offset to the integrated circuit.

11. The module assembly of claim 8, wherein the heating element is configured to be externally controlled by a signal applied to the input/output terminal or to be internally controlled by the integrated circuit.

12. The module assembly of claim 1, wherein the X-ray sensor is configured for direct or indirect conversion.

13. A method for manufacturing a module assembly for detection of X-ray radiation according to claim 1, comprising:

building up a panel assembly using a panel level process, the panel assembly including a first panel (P1) for forming the first interposer, a second panel for forming the second interposer and a plurality of integrated circuits mounted to a surface of the first panel and a mold compound being arranged between the first and the second interposer such that each of the first and the second interposer is in direct contact with the mold compound, singularizing the panel assembly to provide individual ones of the system-in-package structure, placing a respective X-ray sensor on each of the individual ones of the system-in-package structure.

14. An X-ray detector, comprising:

a plurality of the module assembly for detection of X-ray radiation as claimed in claim 1, wherein each X-ray sensor of the module assemblies comprises a pixelated detector area including a plurality of pixels to respectively receive the X-ray radiation, wherein the plurality of the module assemblies are arranged side by side so that the respective pixelated detector area of the X-ray sensors abuts each other without forming a gap there between.

15. A device for medical diagnostics, comprising:

the X-ray detector of claim 14, wherein the device is configured as an X-ray apparatus for a computed tomography scanner.

* * * * *